US007355914B2

(12) United States Patent
Raszka

(10) Patent No.: US 7,355,914 B2
(45) Date of Patent: Apr. 8, 2008

(54) METHODS AND APPARATUSES FOR A SENSE AMPLIFIER

(75) Inventor: Jaroslav Raszka, Fremont, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 11/590,695

(22) Filed: Oct. 30, 2006

(65) Prior Publication Data

US 2007/0041236 A1    Feb. 22, 2007

(51) Int. Cl.
*G11C 7/02* (2006.01)
(52) U.S. Cl. ............. 365/207; 365/185.05; 365/185.21
(58) Field of Classification Search .............. 365/205, 365/207, 185.05, 185.07, 185.21, 210; 327/51–53, 327/55

See application file for complete search history.

(56) References Cited

U.S. PATENT DOCUMENTS

| 4,375,086 | A | 2/1983 | van Velthoven |
| 4,467,457 | A | 8/1984 | Iwahashi et al. |
| 4,672,580 | A | 6/1987 | Yau et al. |
| 4,807,188 | A | 2/1989 | Casagrande |
| 4,884,241 | A | 11/1989 | Tanaka et al. |
| 4,951,257 | A | 8/1990 | Imamiya et al. |
| 4,970,691 | A | 11/1990 | Atsumi et al. |
| 5,027,171 | A | 6/1991 | Reedy |
| 5,251,171 | A | 10/1993 | Yamauchi |
| 5,253,196 | A | 10/1993 | Shimabukuro et al. |
| 5,299,162 | A | 3/1994 | Kim et al. |
| 5,331,597 | A | 7/1994 | Tanaka |
| 5,424,000 | A | 6/1995 | Winicov et al. |
| 5,430,670 | A | 7/1995 | Rosenthal |
| 5,552,728 | A * | 9/1996 | Lin ............................. 327/57 |
| 5,587,945 | A | 12/1996 | Lin et al. |
| 5,638,325 | A | 6/1997 | Hamamoto |
| 5,668,752 | A | 9/1997 | Hashimoto |
| 5,732,022 | A | 3/1998 | Kato et al. |
| 5,742,542 | A | 4/1998 | Lin et al. |
| 5,761,121 | A | 6/1998 | Chang |
| 5,768,186 | A | 6/1998 | Ma |
| 5,781,489 | A | 7/1998 | Okamoto |
| 5,801,076 | A | 9/1998 | Ghneim et al. |
| 5,805,013 | A | 9/1998 | Ghneim et al. |

(Continued)

OTHER PUBLICATIONS

McPartland et al., "1.25 Volt, Low Cost, Embedded FLASH Memory for Low Density Applications", 2000 Symposium on VLSI Circuits Digest of Technical Papers, pp. 158-161.

(Continued)

*Primary Examiner*—Gene N. Auduong
(74) *Attorney, Agent, or Firm*—Rutan & Tucker, LLP

(57) ABSTRACT

Various apparatuses and methods in which a sense amplifier circuit couples to a current source to provide current for the sense amplifier circuit and also couples to one or more memory cells to sense a charge being stored by each memory cell. Store protection circuitry reduces a voltage potential across critical nodes of the sense amplifier circuit to a difference between a store voltage and Vdd when the store voltage is about to be applied to any of the one or more memory cells. The store protection circuitry connects Vdd to one or more of the critical nodes of the sense amplifier circuit when the store voltage is about to be applied to any of the one or more memory cells.

19 Claims, 14 Drawing Sheets

U.S. PATENT DOCUMENTS

| | | |
|---|---|---|
| 5,808,953 A | 9/1998 | Kim et al. |
| 5,854,114 A | 12/1998 | Li et al. |
| 5,885,870 A | 3/1999 | Maiti et al. |
| 5,942,780 A | 8/1999 | Barsan et al. |
| 5,999,466 A | 12/1999 | Marr et al. |
| 6,018,477 A | 1/2000 | Wang |
| 6,046,926 A | 4/2000 | Tanaka et al. |
| 6,064,105 A | 5/2000 | Li et al. |
| 6,069,382 A | 5/2000 | Rahim |
| 6,084,820 A | 7/2000 | Raszka |
| 6,094,394 A | 7/2000 | La Rosa |
| 6,133,098 A | 10/2000 | Ogura et al. |
| 6,144,581 A | 11/2000 | Diorio et al. |
| 6,295,226 B1 | 9/2001 | Yang |
| 6,324,097 B1 | 11/2001 | Chen et al. |
| 6,330,186 B2 | 12/2001 | Tanaka |
| 6,331,951 B1 | 12/2001 | Bautista, Jr. et al. |
| 6,337,808 B1 | 1/2002 | Forbes |
| RE37,593 E | 3/2002 | Etoh et al. |
| 6,370,061 B1 | 4/2002 | Yachareni et al. |
| 6,407,946 B2 | 6/2002 | Maruyama et al. |
| 6,411,097 B1 * | 6/2002 | Ashtiani et al. ............. 324/434 |
| 6,417,728 B1 | 7/2002 | Baschirotto et al. |
| 6,445,614 B1 | 9/2002 | Tsai et al. |
| 6,473,356 B1 | 10/2002 | Raszka |
| 6,631,087 B2 | 10/2003 | DiPede et al. |
| 6,674,665 B1 | 1/2004 | Mann et al. |
| 6,788,574 B1 | 9/2004 | Han et al. |
| 6,842,375 B1 | 1/2005 | Raszka |
| 6,992,938 B1 | 1/2006 | Shubat et al. |
| 7,130,213 B1 | 10/2006 | Raszka et al. |
| 7,130,235 B2 * | 10/2006 | Perner ........................ 365/207 |
| 2001/0028590 A1 | 10/2001 | Ishikawa et al. |

OTHER PUBLICATIONS

Simon J. Lovett, "The Nonvolatile Cell Hidden in Standard CMOS Logic Technologies", IEEE Transactions on Electron Devices, vol. 48, No. 5, May 2001, pp. 1017-1018.

Ohsaki et al., "A Single Polysilicon wafer EEPROM Cell Structure for Use in Standard CMOS Processes", IEEE Journal of Solid-State Circuits, vol. 29, No. 3, Mar. 1994, pp. 311-316.

* cited by examiner

| Legal Controls | CS1 | CD1 | CS2 | CD2 |
|---|---|---|---|---|
| Differential Sensing | Non-Active | Active | Non-Active | Active |
| Sensing 1 | Non-Active | Active | Active | Non-Active |
| Sensing 2 | Active | Non-Active | Non-Active | Active |
| Idle | Active | Non-Active | Active | Non-Active |
| Sense Error | Active | Non-Active | Active | Non-Active |

FIGURE 5

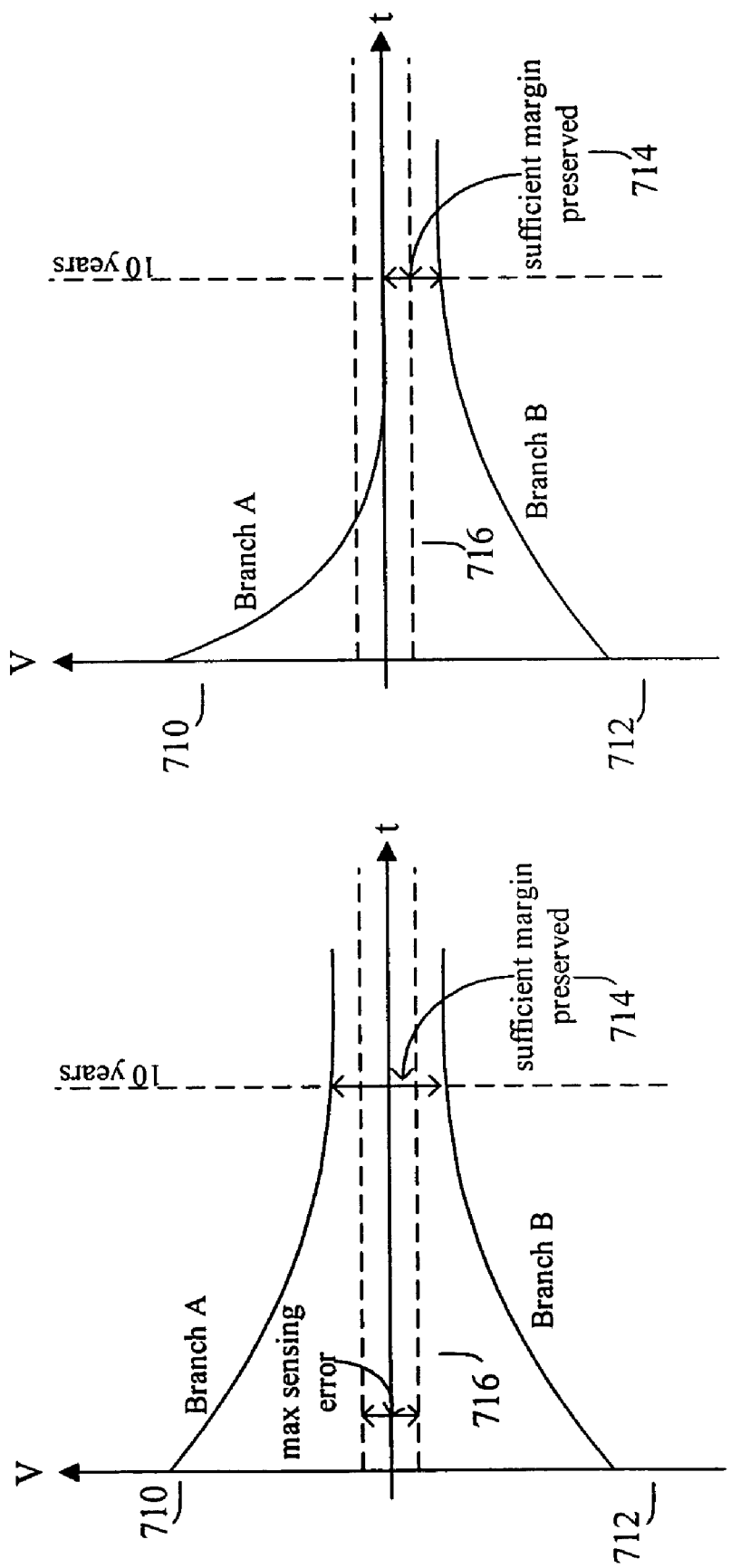

METHODS AND APPARATUSES FOR A SENSE AMPLIFIER

RELATED APPLICATION

This application is a non-provisional application that claims benefit of the file date of both U.S. Pat. No. 7,130,213, filed Dec. 6, 2002 and U.S. Provisional Patent Application Ser. No. 60/340,149, filed Dec. 6, 2001.

FIELD OF THE INVENTION

Embodiments of the invention generally relate to digital memory cells and devices. More particularly, an aspect of an embodiment of the invention relates to the dual polarity storage of data within an electrically-alterable non-volatile memory cell.

BACKGROUND OF THE INVENTION

Non-volatile memories are those memories that are capable of retaining the data stored in their cells for a significantly long time, usually in excess of ten years, after they were disconnected from a power supply. The use of floating gates in non-volatile memory, and in particular in metal-oxide semiconductor field effect transistors (MOSFET) is common in the art. Digital devices include Electrically Programmable Read Only Memory (EPROM), Electrically Erasable Programmable Read Only Memory (EEPROM), and Flash memories. Digital devices typically have a range of a data or other information corresponding generally to a logic value of "0" or a logic value of "1". These devices have a large range of application in both embedded and stand-alone components. However, the requirements from such memory may vary significantly depending on the specific application in which such memory is to be used. For example, the dominant requirement may be the storage of large quantities of data and emphasize the smallest possible cell size. In other cases, the amount of data to be stored is quite small and it is important to ensure that the additional costs that are required for enabling a circuit to be a non-volatile memory are minimized.

There exists a multitude of solutions for implementation of non-volatile memories most of which typically require deviation from a standard CMOS manufacturing process. Many applications use a non-volatile memory storing a relatively small number of non-volatile bits. The use of the non-standard processes to generate such a non-volatile memory results in a higher cost especially in embedded applications. While two chips solutions are possible they do suffer from other cost penalties, as well as additional power consumption, slower frequency operation, and added system level complexity. Van Velthoven in U.S. Pat. No. 4,375,086, Kim et al. in U.S. Pat. No. 5,299,162, Rosenthal in U.S. Pat. No. 5,430,670 and others show various approaches to such non-volatile memories.

The requirements for a special layer for the floating gate have to do with the need for special thickness oxide layer to ensure the trapping of charges. This can be important for such devices. An industry requirement for non-volatile memory cells is retention of data stored in a non-volatile memory cell. Retention is the ability to retain the data stored in the cell for an extended period of time is the ability to retain the data stored in the cell for an extended period of time after the cell was disconnected from its power source. The typical industry standard for retention is ten years. The single poly standard process has an oxide layer which is generally too thin for successful retention of data for extended periods of time and, which deteriorates significantly as line widths decrease into the sub-micron level, i.e., one micron and below. For example, a floating gate charged using a single poly process can lose its' charge rapidly and within less than a month may result in returning to such low levels that make it impractical to be used as a non-volatile memory device. Thus, in some single polysilicon implementations, the oxide thickness determining the quality of the capacitor is not sufficient resulting in a leaky coupling capacitor, and, hence the device does not meet industry standards for retention. Many times it may be impossible or at least impractical to attempt to sense the low residual charge voltage remaining in the cell.

A method for differential sensing of data from a non-volatile memory cell includes the use of two matrices of non-volatile memory cells aiming to sense a difference between two values to determine the correct data. In a first matrix, the data is written as is and in the other the complimentary value is written. A differential amplifier is used to sense the data from the complimentary pair. Atsumi et al in U.S. Pat. No. 4,970,69 and Tanaka in U.S. Pat. No. 6,330,186 made such suggestions. A significant disadvantage of the use of such differential approaches is that if one bit in either matrix is deemed inoperable then the entire memory cell is also deemed inoperable. For example, one bit in either matrix may be deemed inoperable due to a faster leakage than the other bit, which in turn renders the cell not able to conform to a minimum industry retention requirement, and thus disqualifies the product.

SUMMARY OF THE INVENTION

Various apparatuses and methods in which a sense amplifier circuit couples to a current source to provide current for the sense amplifier circuit and also couples to one or more memory cells to sense a charge being stored by each memory cell. Store protection circuitry reduces a voltage potential across critical nodes of the sense amplifier circuit to a difference between a store voltage and Vdd when the store voltage is about to be applied to any of the one or more memory cells. The store protection circuitry connects Vdd to one or more of the critical nodes of the sense amplifier circuit when the store voltage is about to be applied to any of the one or more memory cells.

BRIEF DESCRIPTION OF THE DRAWINGS

The drawings refer to embodiments of the invention in which:

FIG. 5 illustrates a table of the legal control signals of an embodiment of the sensing control circuit;

FIG. 7a illustrates a voltage discharge versus time graph showing a discharge of function of an embodiment a dual polarity electrically-alterable non-volatile memory cell;

FIG. 7b illustrates a voltage discharge versus time graph showing a discharge of a functioning of an embodiment a dual polarity electrically-alterable non-volatile memory cell;

Figure 1A:
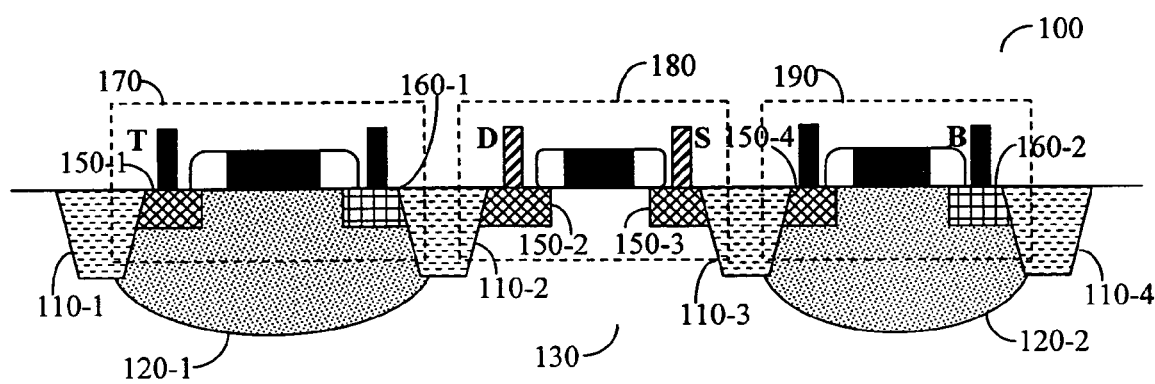
FIG. 1A illustrates a cross sectional view of a portion of an embodiment of the dual polarity non-volatile electrically-alterable memory cell.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of memory columns in a group of memory columns, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first coupling capacitor, may be made. However, the specific numeric reference should not be interpreted as a literal sequential order but rather interpreted that the first coupling capacitor is different than a second coupling capacitor. Thus, the specific details set forth are merely exemplary. The specific details may be varied from and still be contemplated to be within the spirit and scope of the present invention. The term coupled is defined as meaning connected either directly to the component or indirectly to the component through another component.

In general, various apparatuses and methods are described in which a dual-polarity non-volatile memory cell includes a sense mode component and a charge mode component. The sense mode component communicates information, usually a logical 1 or a logical 0, stored in the dual-polarity non-volatile memory cell during a read operation. The charge mode component facilitates storing of the information stored in the dual-polarity non-volatile memory cell. The charge mode component includes a first coupling capacitor and a second tunneling capacitor in a first well, and a first tunneling capacitor a second coupling capacitor in a second well.

FIG. 1A illustrates a cross sectional view of a portion of an embodiment of the dual polarity non-volatile electrically-alterable memory cell. The non-volatile electrically-alterable memory cell 100 includes a coupling capacitor 170, a read transistor 180, and a tunneling capacitor 190. The coupling capacitor 170 is comprised of an N+ doped region 150-1 and a P+ doped region 160-1 in an N-well 120-1. The N-well 120-1 is doped in P-substrate 130. The read transistor 180 is comprised of two N+ doped regions 150-2 and 150-3, designating the drain ("D") and source ("S") respectively. The source and drain are doped within P-substrate 130. The tunneling capacitor 190 is comprised on an N+ doped region 150-4 and a P+ doped region 160-2 in an N-well 120-2. The N-well 120-2 is doped in P-substrate 130.

Figure 2:
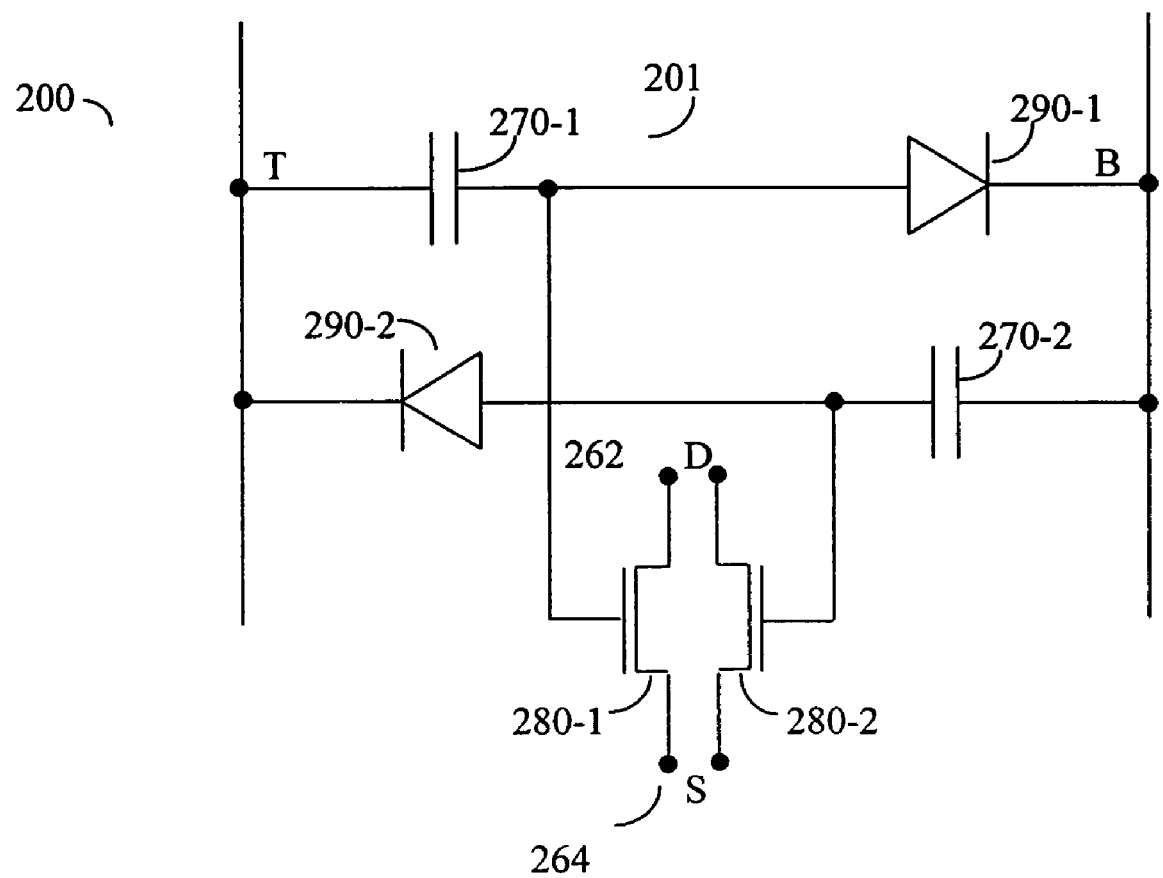
FIG. 2 illustrates a schematic drawing of an embodiment of a dual-polarity non-volatile memory (DPNVM) cell.

The coupling capacitor 170 can be charged through the tunneling capacitor 190, by applying a storing voltage across the B terminal and T terminal. The storing voltage is usually greater in magnitude than the power supply voltage. Referring to FIG. 2, coupling capacitor 270-1 can be charged through the tunneling capacitor 290-1, by applying the storing voltage across the B terminal and T terminal. At the same time, coupling capacitor 270-2 is charged in the opposite polarity through the tunneling capacitor 290-2.

A sense amplifier (not shown) may connect to the read transistor 180 to detect the state of the cell, either charged or discharged. Read transistor 180 is an N-channel transistor. Read transistor 180 conducts current flow through an N-channel between the drain "D" and source "S" when an appropriate bias is sensed on the gate of the read transistor 180. An N-channel based read transistor implementation is illustrated in FIG. 1; however, a P-channel read transistor could also easily be implemented.

An embodiment of a portion of the dual polarity non-volatile electrically-alterable memory cell implements the non-volatile electrically-alterable memory cells disclosed in detail in U.S. patent application entitled, "ELECTRICALLY-ALTERABLE NON-VOLATILE MEMORY CELL" U.S. Pat. No. 7,095,076 issued on Aug. 22, 2006.

A known phenomenon of capacitors is the discharge of stored charge over time due to leakage conditions. Hence, while it is possible to charge a capacitor to a desired voltage level, over time a discharge will take place and the charges placed in the capacitor are lost. In previous single polysilicon technologies, this discharge results in voltage level reduction eventually making it difficult to distinguish between a charged and discharged cell. A common industry standard exists that a non-volatile memory cell should be able to retain its data for a period of at least ten years.

Figure 1B:
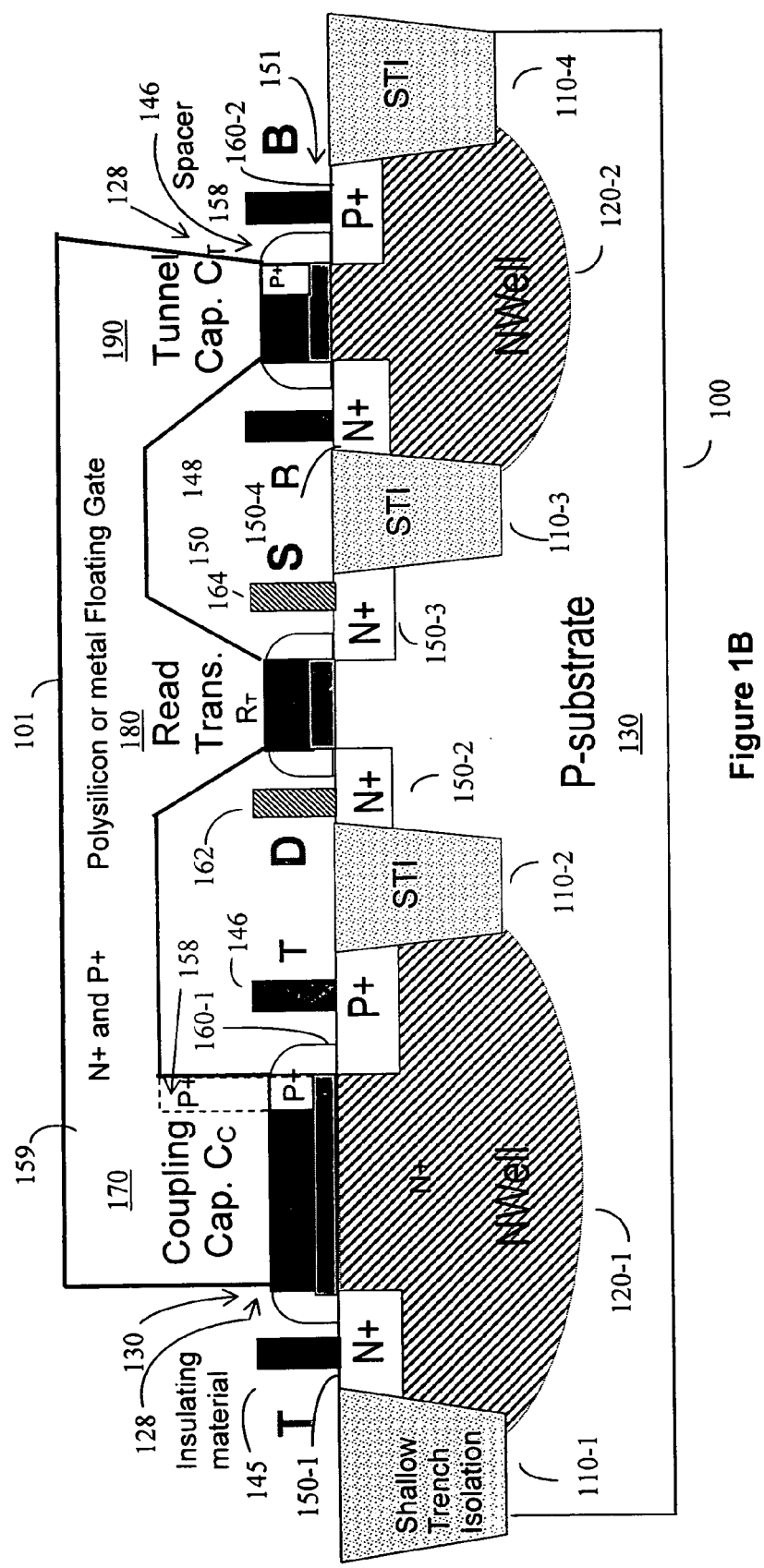
FIG. 1B illustrates a cross sectional view of a portion of an embodiment of the dual polarity non-volatile electrically-alterable memory cell with a floating gate and formed from a single layer of polysilicon.

FIG. 1B illustrates a cross sectional view of a portion of an embodiment of the dual polarity non-volatile electrically-alterable memory cell with a floating gate and formed from a single layer of polysilicon. The coupling capacitor 170 has a first gate/plate 108 composed of both N+ doped material 159 and P+ doped material 158. The N+ doped and P+ doped gate 108 is surrounded by a first P+ doped region 160-1 abutted to a first N+ doped region 150-1. In between the first gate 108 and the first P+ doped region 160-1 abutted to the first N+ doped region 150-1 are a first spacer 130 and a second spacer 132. An insulating material 128 exists between the first gate 108 and the N+ doped NWell region 120-1. The P+ doped region 160-1 connects to the first side of the insulating material 128 and the N+ doped region 150-1 connects to the second side of the insulating material 128. On either side of the coupling capacitor 170 exists shallow trench isolations 110-1, 110-2. Mounted on the first N+ doped region 150-1 is one or more N+ contacts 145. Mounted on the first P+ doped region 160-1 is one or more P+ contacts 146. The N+ contacts 145 and P+ contacts 146 may be electrically connected, for example, by a wire to be logically and electrically the same point, a common T terminal, but physically still separated components.

The tunneling capacitor 190 may have a second plate/gate 126 composed of both N+ doped material 159 and P+ doped material 158. A second N+ doped region 150-4 and a second P+ doped region 160-2 abut together and surround the second gate 126. In between the regions 150-4, 160-2 and the second gate 126 exists a third spacer 146 and a fourth spacer 148. Further, insulating material 128 exists between the second gate 126 and the N+ doped NWell region 120-2. The second P+ doped region 160-2 connects to the first side of the insulating material 128 and the second N+ doped region 150-4 connects to the second side of the insulating material 128. Also, shallow trench isolations 110-4, 110-3 exist on either side of the tunneling capacitor 190. Mounted on the second N+ doped region 150-4 is one or more N+ contacts 150. Mounted on the second P+ doped region 160-2 is one or more P+ contacts 151. The N+ contacts 150 and P+ contacts 151 may be electrically connected, for example, by a wire to be logically and electrically the same point, a common B terminal, but physically still separated components.

The read transistor 180 consists of a third gate 120 separated from a third N+ region 150-2 and a fourth N+ region 150-3 abut together. The third gate 120 isolates from the N+ regions 150-2, 150-3 through use a fifth spacer 156 and sixth spacer 102. Insulating material 128 exists between the third gate 120 and a P-substrate 130. The first gate 108 of the coupling capacitor 170 and the second gate 126 of the tunneling capacitor 190 are predominately doped N+. However, each of these gates has one or more partitioned areas 158 where in those areas they are doped P+. In an embodiment, a floating gate 101 encompasses the first plate 108, the second plate 126, and the third gate 120. The floating gate 101 is fabricated from a single layer of polysilicon using a complementary metal oxide semiconductor logic process employing equal to or less than 1.0 micron technology. The floating gate 101 may have between seventy and ninety five percent of the floating gate N+ doped and one ore more partitioned areas of the floating gate are P+ doped.

The drain terminal 162 of the read transistor 180 connects to the third N+ region 150-2. The source terminal 164 connects to the fourth N+ region 150-3. Shallow trench isolations 110-2, 110-3 exist on either side of the read transistor 180. Note, in an embodiment, LOCOS (local oxidation of silicon) may be used instead of shallow trench isolations.

In an embodiment, the charge mode component operates as a capacitive divider to store information in the electrically-alterable non-volatile memory cell by symmetrical movement of charge. In an embodiment, the charge mode component may include two or more capacitive divider networks as illustrated in FIG. 2.

Figure 1C:
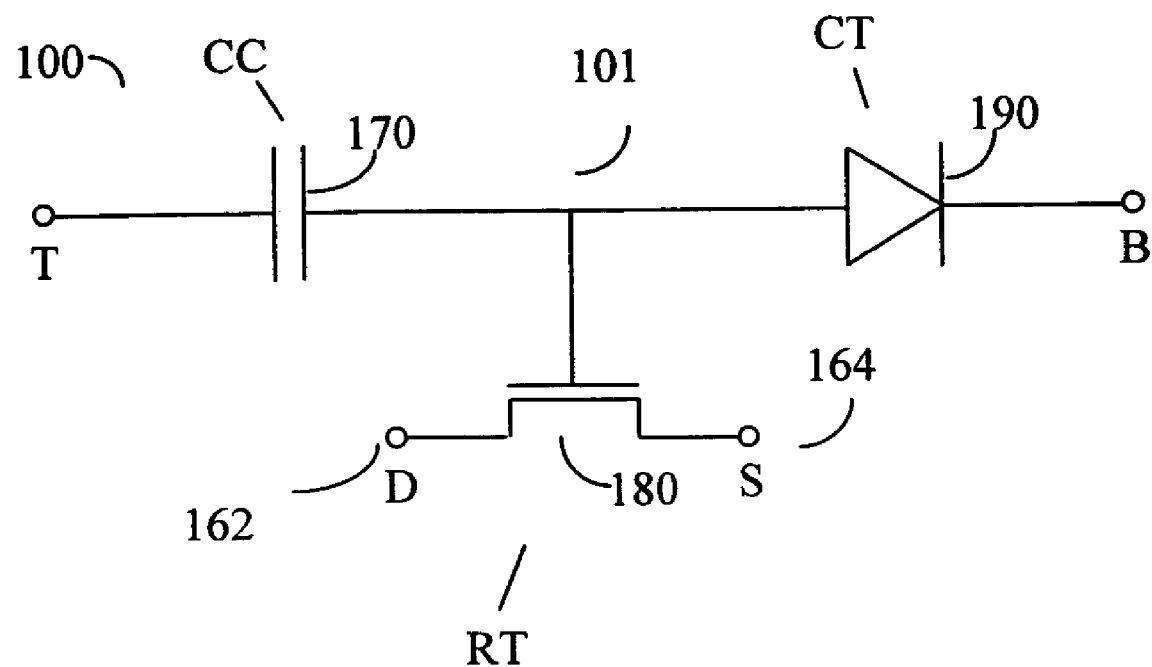
FIG. 1C illustrates a schematic drawing of an embodiment of the portion of the non-volatile electrically-alterable memory cell.

FIG. 1C illustrates a schematic drawing of an embodiment of the portion of the non-volatile electrically-alterable memory cell. The first portion of the electrically-alterable non-volatile memory cell 100 consists of the tunneling capacitor 190 (CT), the coupling capacitor 170 (CC) and the read transistor 180 (RT). These three components share a single floating gate 101. The coupling capacitor 170 in conjunction with the tunneling capacitor 190 form the charging component. The charging component is operable to facilitate storing of information in the electrically-alterable non-volatile memory cell 100. The sense component communicates information stored in the electrically-alterable non-volatile memory cell 100 during a read operation. Thus, the charge operation enables retention of information after the power is turned off, while the sense operation allows the previously stored information to be accessed after powering the memory back up.

The store voltage is applied to terminal T, which modulates the floating gate 101. Electrically charging the electrically-alterable non-volatile memory cell 100 requires a higher than nominal power supply voltage, such as 7 volts, to charge up the floating gate 101. In an embodiment, the electrically-alterable non-volatile memory cell store operations are achieved by means of direct tunneling of electrons into and out of floating gate 101 through the tunneling capacitor 190 to alter the charge state of the memory cell.

FIG. 2 illustrates a schematic drawing of an embodiment of a dual-polarity non-volatile memory (DPNVM) cell. The DPNVM cell 200 may be formed from two non-volatile electrically-alterable memory cells connected in reverse polarity to each other. For example, the dual-polarity non-volatile memory cell may be formed from two cells shown in FIG. 1a, in FIG. 1b, or other non-volatile memory cells. In an embodiment, the dual-polarity non-volatile memory cell includes a first coupling capacitor 270-1, a first tunneling capacitor 290-1, a first read transistor 280-1, a second coupling capacitor 270-2, a second tunneling capacitor 290-2, and a second read transistor 280-2. A plate of the coupling capacitor 270-1 of the first portion of the non-volatile electrically-alterable memory cell is connected to the plate of tunneling capacitor 290-2 of the second portion of the non-volatile electrically-alterable memory cell. Similarly, a plate of the coupling capacitor 270-2 of the second portion of the non-volatile electrically-alterable memory cell is connected to the plate of tunneling capacitor 290-1 of the first portion of the non-volatile electrically-alterable memory cell.

After a store operation the coupling capacitor 270-1 may be effectively charged to a negative value and the coupling capacitor 270-2 may be charged to a positive value. Therefore, instead of storing charge in a single coupling capacitor two are now storing charge, and naturally, the two will discharge up to a residual voltage, one positive and one negative. It should be noted that these discharges are to a mutual value that may be different than zero as shown in FIG. 7a. In manufacturing it is possible that trapped charges result in the mutual voltage being different than zero, typically for a CMOS process a slightly positive value.

The charge stored by coupling capacitor 270-1 is coupled through a first floating gate to the gate of the first read transistor 280-1. The opposite polarity charge stored by coupling capacitor 270-2 is coupled through a second floating gate to the gate of the second read transistor 280-2. As a result of the discharge from a dual polarity implementation, a differential voltage can be measured between the drain terminals of read transistor 280-1 and read transistor 280-2, by connecting a differential sense amplifier to the respective drains ("D"). In an embodiment, even after ten years of discharge, the residual differential voltage is sufficiently large for accurate sensing and hence the ability to implement a highly reliable non-volatile memory cell using a single poly process. Moreover, the dual polarity non-volatile memory cell will function even if one of the portions of the non-volatile electrically-alterable memory cells is non-functional, therefore adding built-in redundancy as well as providing for effectively higher endurance. Note, a DPNVM memory cell may be implemented using P-channel read transistors rather than the N-channel read transistors 280-1 and 280-2.

The dual polarity electrically-alterable non-volatile memory cell 200 may be set up for a read operation on each portion of the electrically-alterable non-volatile memory cell 200. For example, a sense voltage is applied to the D terminal 262 and the source terminal 264 is grounded. The read transistor 280-1 is biased to detect minor changes of the charge detected on the gate of the read transistor 280-1. The read transistor 280-1 communicates the information stored by that memory cell based upon the charge stored in the floating gate 201. The charge stored in the floating gate 201 modulates conductivity of the read transistor 280-1. For example, when the net charge introduced into the floating gate is predominantly negative the conductivity of the read transistor 280-1 is decreased indicating that this memory cell stores a logical 1.

Similarly, the second portion of the electrically-alterable non-volatile memory cell 200 may also be read independently of the charge stored in the first portion. As will be described later, the differential voltage stored between the first portion and the second portion may also be read.

Figure 3:
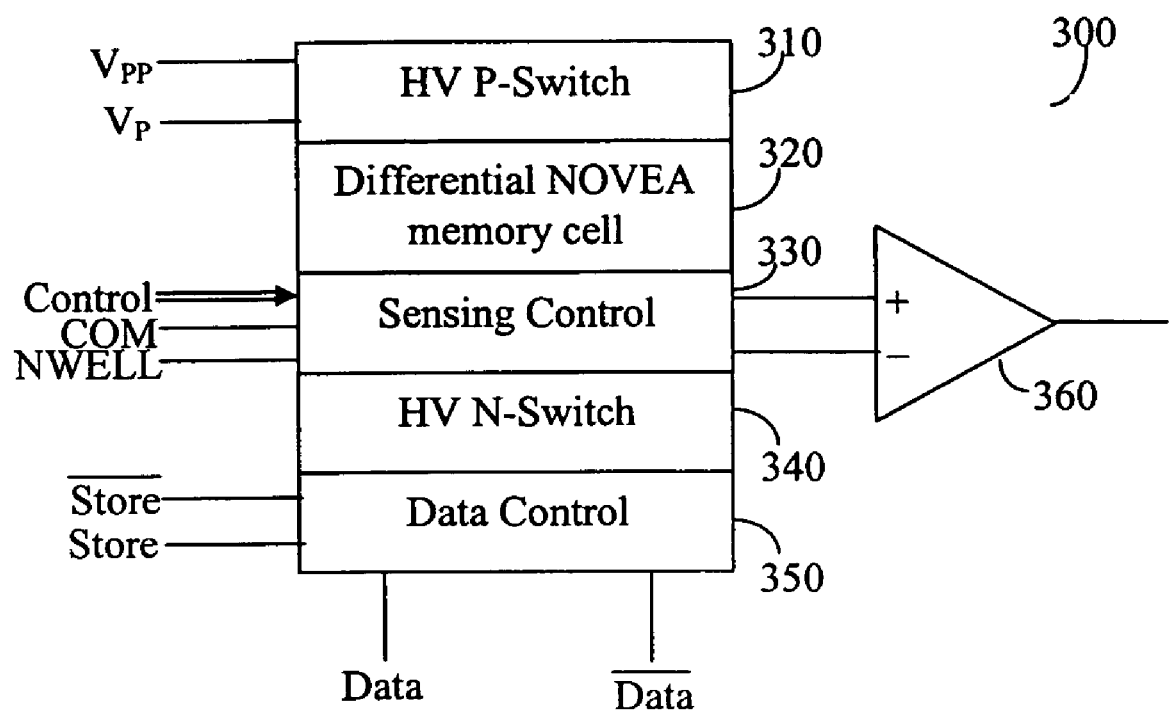
FIG. 3 illustrates a block drawing of an embodiment of a single DPNVM bit/cell.

FIG. 3 illustrates a block drawing of an embodiment of a single DPNVM bit/cell. High voltage is supplied and controlled through both a high voltage P switch 310 and a high voltage N switch 340. Data is supplied to the circuit through data control circuit 350 that receives both the data and the inverse of the data. The DPNVM memory cell 320 is connected such that it can receive the high voltage for storing purposes, as well as to the sensing control 330, which is further connected to sense amplifier 360.

Sensing control 330 is capable of connecting sense amplifier 360 to the DPNVM memory cell 320 in multiple configurations. In differential mode, the configuration is such that both read transistors 280-1 and 280-2 drains are effectively connected to the sense amplifier. As previously described, in a single mode, the configuration is such that only information stored by a single coupling capacitor is sensed by sense amplifier 360.

Figure 4:
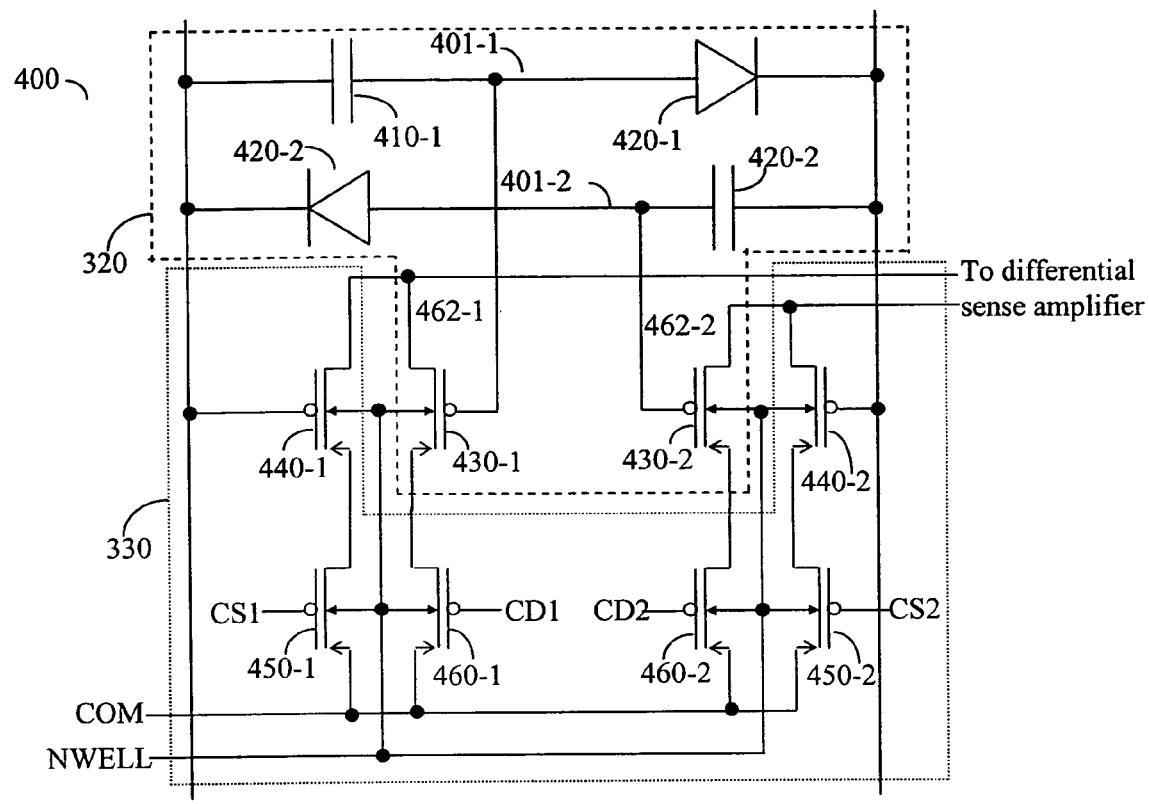
FIG. 4 illustrates a schematic drawing of an embodiment of the sensing control circuitry connected to a DPNVM cell.

FIG. 4 illustrates a schematic drawing of an embodiment of the sensing control circuitry connected to a DPNVM cell. Referring to FIG. 4, the circuits for the DPNVM memory cell 320 and the sensing control 330 are shown. The DPNVM memory cell 320 differs from the implementation shown in FIG. 2, as the read transistors 430-1 and 430-2 are implemented with P-channel transistors while the read transistors 280-1 and 280-2 are N-channel transistors. However, other than the required operational voltages the circuits are similar. During a store operation a high voltage is applied across each set of coupling capacitor 410-1, 410-2 and tunneling capacitors 420-1, 420-1. Afterward, the second coupling capacitor stores 410-1 a charge opposite in polarity to the charge stored in the first coupling capacitor 410-2. Thus, the first floating gate 401-1 will have, for example, a positive voltage potential. Correspondingly, the second floating gate 401-2 will have, for example, a negative voltage potential.

A drain terminal 462-1 of the first read transistor 430-1 is connected to a first input of the sense amplifier and a drain terminal 462-2 of the second transistor 430-2 is connected to a second input of the sense amplifier. The sensing control circuit includes four P-channel transistors, where transistors 450-1 and 460-1 control the reading from the first portion of the non-volatile electrically-alterable memory cell, while transistors 450-2 and 460-2 control the second portion of the non-volatile electrically-alterable memory cell. The charge stored at either or both floating gates 401-1, 401-2 may be sensed by a differential sense amplifier through the operation of these four P-channel transistors, transistors 450-1 and 460-1, 450-2 and 460-2. Transistors 440-1 and 440-2 provide a reference potential when their respective paths are used in a single mode.

FIG. 5 illustrates a table of the legal control signals of an embodiment of the sensing control circuit. The sensing control circuit 330 may provide a control signal to sense the non-volatile memory cell in both differential sensing mode and single mode.

Referring to FIG. 4, to have circuit 400 read/sensed in a differential mode, sensing control circuit 330 may provide a control signal to the gates of transistors 450-1 (CS1) and 450-2 (CS2) that is their non-active value, while the gates of transistors 460-1 (CD1) and 460-2 (CD2) receive signal that are their active value. As the example circuit is comprised of P-channel transistors, the active value is a logical low and the non-active is a logical high. When a logical low is applied on a correctly biased P-channel transistor it will be in a conducting mode, while a logical high will result in the transistor being effectively non-conducting. Therefore, when read operation in differential sensing mode occurs, the path from COM through the read transistors 430-1 and 430-2 should be made to conduct by the control signals. Thus, the following electrical path is established: the first input of the differential sense amplifier to the drain 462-1 of the first read transistor 430-1 to the source of the read transistor 430-1 to the drain of transistor 460-1 to the source of transistor 460-1 to circuit common (COM). The conductance of read transistor 430-1 is modulated by the charge present in the first floating gate 401-1. Likewise, a similar path is established in the second portion of the memory cell to allow the second input of the differential sense amplifier to detect the signal present on the drain 462-1 of the second read transistor 430-2. That signal being controlled by the charge present in the second floating gate 401-2. Thus, in the differential mode, the sense amplifier senses the difference between the signal value, i.e. voltage value or current value, read from the drain 462-1 of the first read transistor and the signal value read from the drain 462-2 of the second read transistor.

Thus, the sense amplifier may provide a valid read of the information stored in the non-volatile memory cell even if a failure occurs in either the first read transistor or the second read transistor but not a failure of both. The sense amplifier may provide a valid read of the information stored in the non-volatile memory cell even if a failure occurs in either the first tunneling capacitor or the second tunneling capacitor but not a failure of both. The sense amplifier may provide a valid read of the information stored in the non-volatile memory cell even if a failure occurs in either the first coupling capacitor or the second coupling capacitor but not a failure of both.

Referring to FIG. 5, during a sensing of a single portion of the non-volatile electrically-alterable memory cell, for example, the first portion of the non-volatile electrically-alterable cell, the control signals are placed as shown in the row "sensing 1" of the table in FIG. 5. Referring to FIG. 4, the path for the first read transistor 430-1 and transistor 460-1 is opened by making transistor 460-1 conductive. However, in the second portion of the memory cell, the control signal makes transistor 460-2 non-conductive to cutoff that electrical path and makes transistor 450-2 conductive to connect circuit common to the second input of the differential amplifier. This way one path is used as a reference while the other is connected to the read path of the first portion of the non-volatile electrically-alterable memory cell, i.e., read transistor 430-1.

In the idle mode, transistors CS1 and CS2 are in their active mode while transistors CD1 and CD2 are placed in their non-active mode.

Figure 6:
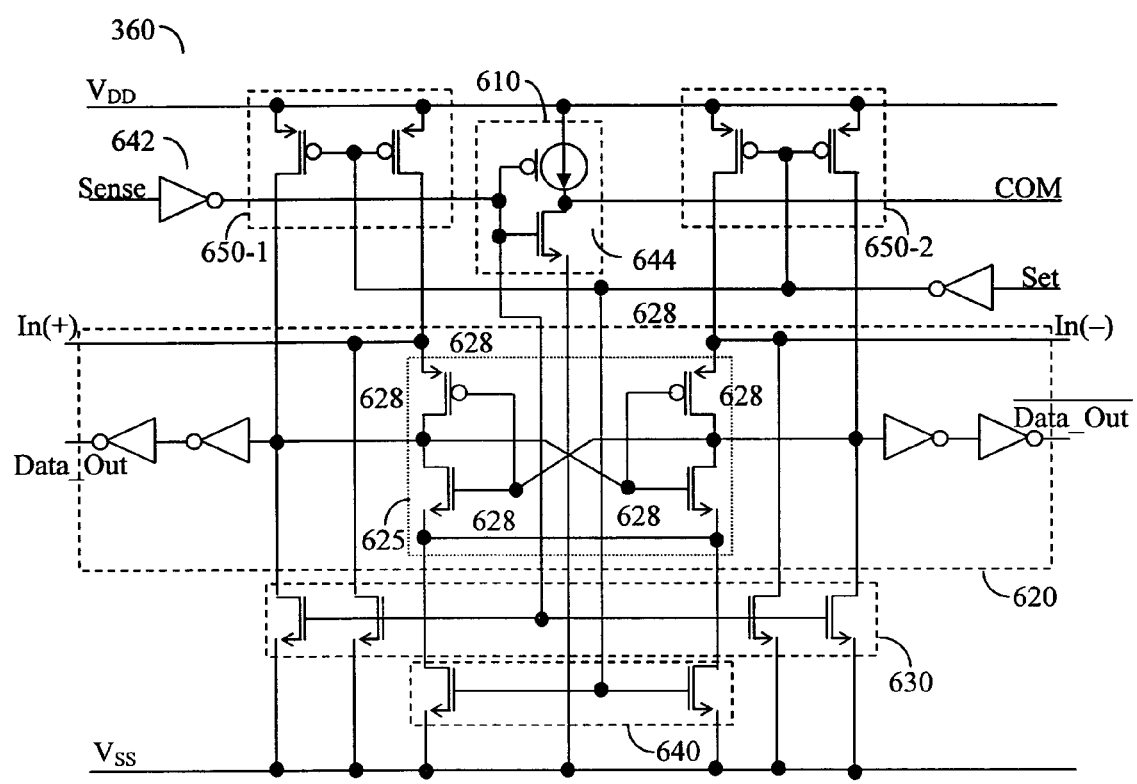
FIG. 6 illustrates a schematic drawing of an embodiment of a differential sense amplifier to cooperate with a DPNVM cell.

FIG. 6 illustrates a schematic drawing of an embodiment of a differential sense amplifier to cooperate with a DPNVM cell. The sense amplifier (SA) 360 circuitry may include a current source 610, sense amplifier circuit 620, sense enable and idling circuitry, and store protection circuitry making it possible to operate as a sense amplifier in the environment of the high voltages such as those present during storing of information into the DPNVM cell. The current source 610 provides the current used during the sense operation. However the idling circuitry may substantially eliminate current drain by the sense amplifier 360 by switching off the current source 610 and reducing the voltage potential across critical nodes 628 of the sense amplifier to substantially zero. The current source 610 activates and disables by using the sense enable circuitry operative through the "Sense" signal. The inverter 642 under the control of the "Sense" signal effectively activates and disables the current source 610 of the sense amplifier at certain times. While the "Sense" signal into the inverter 642 is low, current source 610 is inactive and the N-channel transistor 644 connects the COM signal to Vss. An advantage of this control mechanism is that when there is no need for data sensing from a DPNVM cell, no current is required, hence saving on power consumption. Moreover, it allows for implementation of the store protect circuit explained in more detail below.

When a read operation occurs and thus sensing is required, the "Sense" signal into the inverter 642 is high and as a result the N-channel transistor 644 is cut off while the current source 610 is activated and provides current through the COM line. The COM line is connected to the COM line of circuit 400 described in FIG. 4. The operation of the basic sense amplifier 620 is such that it has a feedback mechanism that enhances the changes in a certain direction. Hence, if In(+) tends to go high, the circuit will operate in such a way that will strengthen this direction, and vice versa.

The control signals of "Sense" and "Set" control the operation of SA 360. The SA 360 is in idle mode when both "Sense" and "Set" signals are low. This happens because current source 610 is deactivated and the N-channel transistor 644 is non-conductive. In addition, the N-channel transistors of circuits 630 and 640 are conductive and therefore connect critical nodes of circuit 625 to Vss. This lowers the voltage level at the critical nodes 628 to a voltage of, for example, 0 volts. The pull-up transistors of 650-1 and 650-2 are off as they are P-channel transistors receiving a high at their respective gates. This mode ensures the lowest possible operational current, if any. Thus, the voltage potential across the components in the sense amplifier circuit 620 is substantially zero.

The sense mode requires that the "Sense" signal be placed at its active value and the "Set" signal at its inactive value. As previously explained the current source 610 will provide the necessary current for the operation of SA 360. The N-channel transistors of 630 will be in their off mode, hence not draining current through them. The N-Channel transistors of 640 will connect circuit 625 to Vss allowing for a closed circuit for current source 610 through the COM signal and back through the In(+) and In(−) lines. Circuit 625 will move from its intermediate position to either show a high value on Data_Out or a low value on Data_Out depending on the inputs at the In(+) and In(−) lines. In an embodiment, the In(+) and In(−) lines act as inputs from the drains of the read transistors in the non-volatile memory cells.

The store protect mode protects the sensitive SA 360 circuitry from any damaged that may be caused by applying the higher voltages used for storing information into the DPNVM. The store voltage may be three or more times greater than the typical operating voltage. The store protect mode is entered by applying active values to both the "Sense" and "Set" signals. As a result critical nodes of circuit 625 are pulled to the power supply voltage, Vdd, as the P-channel transistors of circuits 650-1 and 650-2 are on. This raises the voltage level at the critical nodes to a voltage of, for example, 1.8 volts during a store operation. Thus, when the store voltage is applied to the non-volatile memory cell, the voltage differential across these components is reduced to the difference between the store voltage and Vdd. The critical nodes of the sense amplifier 620 are coupled to a second higher voltage level by use of the store protection circuitry.

In an embodiment, it is illegal to have "Set" in active mode and "Sense" in non-active mode, which will result in significant current drainage and unpredictable results.

FIG. 7a illustrates a voltage discharge versus time graph showing a discharge of function of an embodiment a dual polarity electrically-alterable non-volatile memory cell. The graph illustrates an initial charge 710 stored by the first portion of the non-volatile memory cell and the initial charge 712 stored by the second portion of the non-volatile memory cell. The charge 710, 712 stored by each portion of the dual polarity non-volatile memory cell decreases over time. After a store operation, an exponential discharge of a non-volatile memory cell begins towards a residual positive value for branch A and a residual negative value for branch B. The differential sense amplifier senses the voltage difference between the two portions of the cell, branch A and B, and determines the logical value stored in the cell. A sufficient margin 714 exists to read the data stored by the cell and receive valid results even after ten years. This means that the cell abides by the industry requirements relative to retention. In an embodiment, the DPNVM will function properly and yield valid results because a maximum sensing error voltage of the sense amplifier 716 is designed to be at least smaller than the voltage margin available between the floating gate of the first coupling capacitor and the floating gate of the second coupling capacitor after a predetermined retention period.

FIG. 7b illustrates a voltage discharge versus time graph showing a discharge of a functioning of an embodiment a dual polarity electrically-alterable non-volatile memory cell. The graph illustrates an initial charge 710 stored by the first portion of the non-volatile memory cell and the initial charge 712 stored by the second portion of the non-volatile memory cell. The charge 710, 712 stored by each portion of the non-volatile memory cell decreases over time. However, it is possible that a branch fails and due to a leakage problem loses charges much faster then the other branch. In this case branch "A" may lose most of its charge long before the minimum industry standard of ten years of data retention. However, due to the fact that the DPNVM cell uses a dual-polarity technique, i.e., the data is written in both a positive and negative polarity results in the ability to sense the data using the differential sense amplifier as long as a sufficient margin 714 above the maximum sensing error 716 is maintained.

Thus, the sense amplifier is capable of providing a valid read of the information stored in the non-volatile memory cell under conditions where one of the coupling capacitors is significantly more leaky than the other coupling capacitor. Therefore, the DPNVM cell is capable of providing a valid read of the information stored in the non-volatile memory cell upon failure of either the first coupling capacitor or the second coupling capacitor but not a failure of both branches. Similarly, the DPNVM cell is capable of properly operating upon failure of either the first tunneling capacitor or the second tunneling capacitor but not a failure of both. The DPNVM cell is capable of properly operating upon failure of either the first read transistor or the second read transistor but not a failure of both.

As discussed above, the DPNVM cell simultaneously stores the data in one polarity into one portion of the DPNVM cell and in an opposite polarity to another portion of the DPNVM cell. This scheme provides for lower sensitivity to charge loss, better redundancy, superior endurance, and even if one portion of the cell fails it will be still possible to sense correctly the data as stored in the other corresponding cell portion.

A single poly standard CMOS manufacturing process may create the electrically-alterable dual-polarity non-volatile memory cell. The non-volatile memory solution for embedded and stand alone applications integrates easily with the standard single poly CMOS processes.

A memory compiler may be used to generate a DPNVM based memory array in any designated width and length. The generated design can be embedded within a larger target chip and implemented on a mask set used for the manufacture of such target chip. Multiple DPNVM cells, such as 4K, 16K, etc., may be arranged in columns and rows to form a long term memory for an integrated circuit. Further, one or more DPNVM can share a single sense amplifier. In this case, one or more first read transistors have their drain terminals connected to a first input of the sense amplifier and one or more of drains of the second read transistors are connected to the second input of the sense amplifier. A control signal designates which of the pairs of first read transistor and second read transistor will be sensed by the sense amplifier.

Figure 8A:
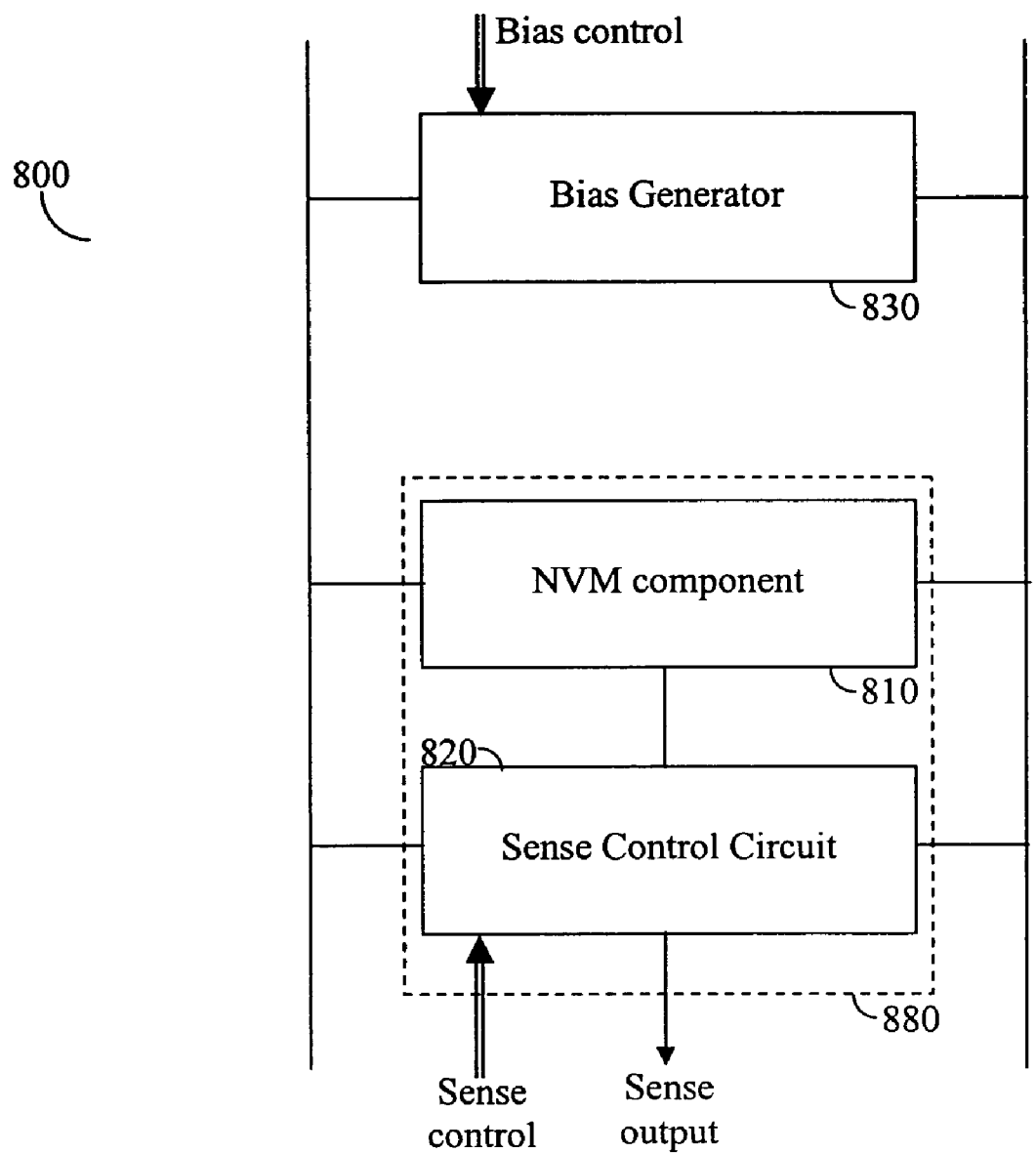
FIG. 8a illustrates a block diagram of an embodiment of a non-volatile memory cell connected to a bias generator.

FIG. 8a illustrates a block diagram of an embodiment of a non-volatile memory cell connected to a bias generator. The circuit comprises of three functional blocks: a non-volatile memory (NVM) component 810, a sense control circuit 820, and a bias generator 830. The NVM component and the sense control circuit form a non-volatile memory cell 880. Multiple non-volatile memory cells 880 may be connected to a single bias generator 830. Typically, the NVM component 810 will include at least a charge storage component used for the non-volatile storage of charges. Bias generator 830 may be an internal, i.e., on-chip component, or external, i.e., connected to an integrated circuit through its input/output pads.

After storing a charge in the charge storage component, the test circuit associated with the bias generator 830 may verify that the storage operation was successful. Further, the test circuit associated with the bias generator 830 may validate that the charge storage component stores a sufficient level of charge to satisfy a minimum a margin of charge storage to overcome any sense error associated with the sense amplifier (not shown) connected to the charge storage component. The minimum a margin ensures that the maximum sense amplifier error will not be larger then the minimum expected voltage margin reached to as a result of charge loss over a period of time, for example, ten years.

The sense amplifier may connect to the sense output of the sense control circuit 820. Bias generator 830, under the control of sense control signals from a bias control circuit, provides one or more reference potentials to the NVM cell 880. Through the use of the sense control signals controlling the operation of the sense control circuit 820, it is possible to sense a specific portion of the NVM component 810 and verify that it is charged with a sufficient margin. The test circuit may monitor the output of the sense amplifier connected to the sense control circuit 820. The test circuit checks whether the sense amplifier outputs a correct value, i.e., the actual logic value stored in the charge storage component, despite the bias voltage being applied by the bias generator 830 to the NVM component 810. By controlling the levels of voltage provided by the bias generator 830, the test circuit to determine accurately the margin available for that particular sense amplifier and NVM cell 880. As described in more detail below, an embodiment of the test circuit may determine a number of additional parameters as well.

Figure 8B:
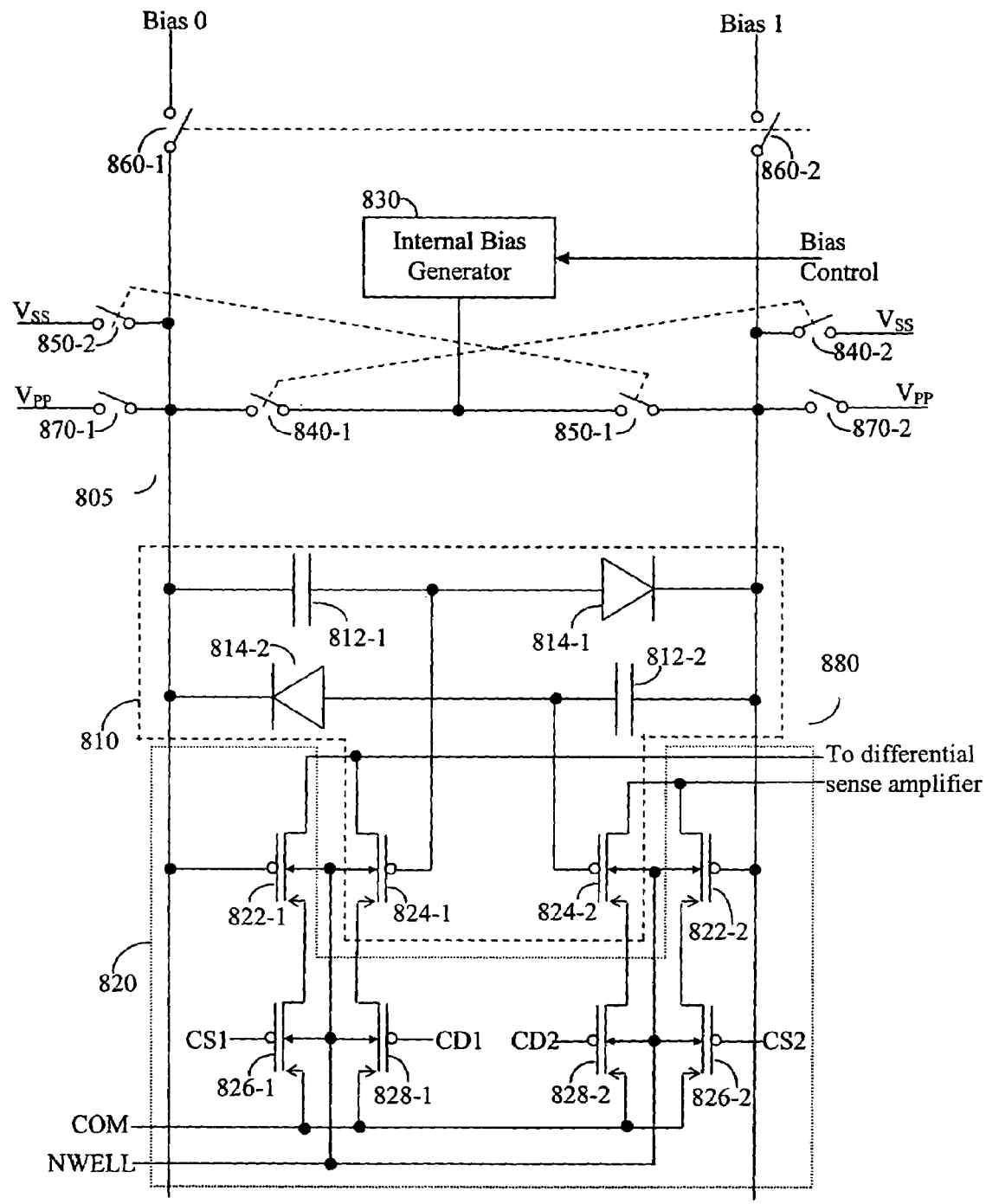
FIG. 8b illustrates a schematic diagram of an embodiment of a dual-polarity non-volatile memory cell coupled to a test circuit.

FIG. 8b illustrates a schematic diagram of an embodiment of a dual-polarity non-volatile memory cell coupled to a test circuit. An embodiment of a dual-polarity non-volatile memory (DPNVM) cell 810 couples to an example sensing control circuit 820 and an example test circuit 805. The dual-polarity non-volatile memory (DPNVM) cell 810 includes coupling capacitor 812-1, tunneling capacitor 814-1, and read transistor 824-1 in the first portion of the memory cell and coupling capacitor 812-2, tunneling capacitor 814-2, and read transistor 824-2 in the second portion of the cell. The sensing control circuit 820 includes six P-channel transistors, 822-1, 826-1, 828-1 822-2, 826-2 and 828-2. The test circuit 805 includes a bias voltage generator 830 and multiple switches 840-1, 840-2, 850-1, 850-2, 860-1, 860-2, 870-1, and 870-2. The bias voltage generator 830 is internal to an integrated circuit containing one or more DPVNM cells. The multiple switches 840-1, 840-2, 850-1, 850-2, 860-1, 860-2, 870-1, and 870-2 connect the internal bias voltage generator (IBG) 830 to various portions of the dual-polarity non-volatile memory cell 810 for testing.

As previously described, charge storage components, coupling capacitors 812-1 and 812-2, are charged through the tunneling capacitors 814-1 and 814-2 respectively. Coupling capacitor 812-1 is charged, for example, to a positive value and coupling capacitor 812-2 is charged in the opposite polarity. A differential sense amplifier (not shown) couples to the drain of read transistors 824-1 and 824-2. The differential sense amplifier senses the value stored in either portion of the DPNVM as well as the difference between the values stored in each portion.

As previously described, transistors 826-1 and 828-1 control the reading of the stored data from the first portion of the non-volatile electrically-alterable memory cell. Likewise, transistors 826-2 and 828-2 control the reading of the stored data from the second portion of the non-volatile electrically-alterable memory cell. Transistors 826 and 828 also enable various test modes as detailed below. The charge stored at either or both coupling capacitors 812-1 and 812-2 may be sensed by the differential sense amplifier through the operation of these four P-channel transistors, transistors 826-1 and 828-1, 826-2 and 828-2. In a differential mode, the gates of transistors 826-1 (CS1) and 826-2 (CS2) are put in their non-active value, while the gates of transistors 828-1 (CD1) and 828-2 (CD2) are put in their active value to sense in a differential mode. In sense 1 mode, the gates of transistors 826-2 (CS2) and 828-1 (CD1) are put in their active value, while the gates of transistors 826-1 (CS1) and 828-2 (CD2) are put in their non-active value to sense the charge stored in the first portion of the nonvolatile memory cell. Similarly, in sense 2 mode, the gates of transistors 826-2 (CS2) and 828-1 (CD1) are put in their non-active value, while the gates of transistors 826-1 (CS1) and 828-2

(CD2) are put in their active value to sense the charge stored in the second portion of the nonvolatile memory cell.

Transistors 822-1 and 822-2 in conjunction with transistors 826-1 and 826-2 provide the reference potential when their respective paths are used to sense a single mode. For the purpose of sensing a single portion of the non-volatile electrically-alterable memory cell, one path, for example COM to 826-2 to 822-2, is used as a reference while the other is connected to the read path of the charge storage component of the first non-volatile electrically-alterable memory cell.

The IBG circuit 830 supplies a range of discrete voltages, for example 200 millivolts (mV), 400 mV, 600 mV and 800 mV. These bias voltages can be supplied to each portion of the DPNVM cell 810 by means of switches 840 and 850, of which only one can be on at a given point in time. By controlling transistors 826 and 828 it is possible to test any single or combined section of DPNVM cell 810. In an embodiment, the IBG 830 may be a resistor ladder comprising of a plurality of resistors, designed to output the steps of discreet desired voltage levels. A person skilled in the art could easily adapt the circuit to provide different bias voltages as may be required. The IBG circuit 830 may receive a control signal from a control circuit to begin incrementally supplying the discrete voltage levels across a set of capacitors, such as 812-1 and 814-1. For example, if switch 850 is closed, then a first discrete voltage, such as 200 mv, is supplied via switch 850-1 to the tunneling capacitor 814-1. Additionally, the coupling capacitor 812-1 completes the electrical path to Vss through switch 850-2.

The control circuit (not shown) also controls the operation of transistors 822-1, 822-2, 826-1, 828-1, 826-2, 828-2 and the switches 840-1, 840-2, 850-1, 850-2, 860-1, 860-2, 870-1, and 870-2 in accordance with table 5. As discussed, the control circuit enables testing of each of the non-volatile storage components, 812-1 and 812-2, independently of the other non-volatile storage component. The IBG circuit 830 may provide the discrete steps of voltage to a single section of the DPNVM 810 in order to accurately determine the offset bias for that portion of the DPNVM. The value determined for the offset voltage can be correlated to the minimum expected voltage margin reached as a result of charge loss in that charge storage component over a period of time, for example of ten years.

The control circuit also enables testing of both non-volatile storage components as a differential component. The control circuit controls the operation of the sense control circuit 820 and test circuit 805 to determine the sense error of the differential sense amplifier in differential sense mode. In the Sense Error mode, transistors 826-1 and 826-2 are in their active mode, while transistors 828-1 and 828-2 are placed in their non-active mode. Further the test circuit allows for the modification of the voltage level of the storing voltage applied to the NVM's charge storage component. The operation of sensing 1, sensing 2, the Sense Error mode, and the modification of the voltage level of the storing voltage are discussed in more detail below.

The following is are two example ways of the testing a single section of DPNVM cell 810 with the bias voltage.

In a first example, the bias generator 830 applies a bias voltage as a go no-go check for the correct readings of the data in each branch therefore validating the operation as a dual-polarity non-volatile memory. Thus, if a logical "1" is stored in the DPNVM component 810 the positive branch is first tested by applying a certain bias voltage to it, for example, by having switch 840 in its on (i.e., conducting) position. Only the branch comprising of coupling capacitor 812-1 and tunneling capacitor 814-1 is checked. For that purpose the control signals of the sense control signals are set for "sensing 1". If the sense amplifier (not shown) connected to the sense control circuit 820 detects a logical "1" despite the bias voltage being applied to the NVM component 810, then it may be concluded that the maximum sense amplifier error will not be larger then the minimum expected voltage margin reached to as a result of charge loss over a period of ten years. Switch 840 is now put in its off position (i.e., non-conducting) and switch 850 is put in its on position and the sequence is repeated for the other portion of the DPNVM. If the sense amplifier output is also a logical "1" it is concluded that both branches store enough charge to ensure that the maximum sense amplifier error will not be larger then the minimum expected voltage margin reached to as a result of charge loss over a period of ten years. The tests on each portion may be performed if the DPNVM contains a logical value "0" or logical value "1".

In a second example, the "sensing 1" mode occurs, i.e. sensing of the first portion of the DPNVM, which makes transistor 828-1 "on," transistor 828-2 "off," transistor 826-1 "off" and transistor 826-2 "on." The control circuit applies the appropriate control voltage on the respective gate of each transistor such that the transistor is either in the "on", i.e., conducting, or "off", i.e., non-conducting, mode. In sensing 1 mode, read transistor 824-1 is able to sense the logical value of the data stored in the first portion of the DPNVM cell 810, namely coupling capacitor 812-1. The logical value of the data stored in coupling capacitor 812-1 is communicated to the other node of read transistor 812-1 which is connected to the sense amplifier (not shown). The other node of the sense amplifier is connected through the path of transistors 822-2 and 826-2 to COM.

Now, IBG 830 can be connected to the set of capacitors 812-1 and 814-1 by putting switch 850 to "on." When switch 850 is closed, switch 850 connects the output voltage of IBG 830 to coupling capacitor 812-1 and VSS to the other coupling capacitor 812-2. Using the bias control of IBG 830 it is possible to set the voltage to a desired level, for example, 100 mV. The bias voltage from the IBG 830 may slowly be incremented up in steps by control signals from the control circuit to the IBG 830. At the same time, the output of the sense amplifier may be monitored to detect a change in state on that output. When the output of the differential amplifier swings to indicate a logic state change sensed in the DPNVM cell, then the offset voltage for that portion of the DPNVM cell has been determined.

IBG 830, via switches 840 and 850, tests the two portions of the DPNVM cell in their two possible modes of operation, i.e., positive polarity and negative polarity. The first charge storage component, 812-1, is tested to a positive polarity and the second charge storage component 812-2, is tested to a negative polarity.

An external bias voltage generator may provide both a plurality of discrete voltage levels as well as a range of analog voltages to provide a more accurate determination of the offset value. In the case where a more accurate determination of the offset value than determined by the IBG 830 is desired, then the control circuit sends a control signal to use external Bias 0 and external Bias 1. In this case, Bias 0 and Bias 1 connects to the DPNVM cell 810 via switches 860-1 and 860-2. Operation is similar to the description provided for the IBG 830 and either Bias 0 or Bias 1 may be connected to VSS as the case may require.

Also, controlling switches 860-1 and 860-2 to use Bias 0 and Bias 1 from the external bias voltage generator is further of value when used in conjunction with the Sense Error mode. The external bias voltage generator may provide both a plurality of discrete voltage levels as well as a range of analog voltages to provide an accurate determination of the sense error of a differential sense amplifier. In Sense Error mode, the transistors 822-1, 826-1, 822-2 and 826-2 are active while the other transistors 828-1 and 828-2 are inactive. By supplying the same voltage to both Bias 0 and Bias 1, it is possible to determine the error voltage of the sense amplifier connected to DPNVM 810. Thus, the test circuit 805 determines a sense error of the sense amplifier connected between coupling capacitor 812-1 and coupling capacitor 812-2. Normally, if the same voltages are available on both Bias 0 and Bias 1 the output of the sense amplifier should be zero. Determination of the sense error can be used for testing purposes, the trimming of manufacturing process, providing a certain bias voltage from IBG 860 to offset the determined error, or other similar uses.

Further, the test circuit 805 may determine the distribution of sense error for each differential sense amplifier and non-volatile memory cell coupled to the test circuit 805. For example, a first sense amplifier and non-volatile memory cell coupled to the test circuit 805 may have a sense error of 40 millivolts. A second sense amplifier and non-volatile memory cell coupled to the test circuit 805 may have a sense error of 55 millivolts. The distribution of sense error for the whole memory may be collected, stored, and then utilized. This ability of is useful to a DPNVM type solution as it ensures that the maximum sense amplifier error will not be larger then the minimum expected voltage margin reached to as a result of charge loss over a period of ten years.

In an embodiment, a single IBG exists for a plurality of DPNVM cells, however, in an alternative circuit each cell has its separate IBG. Similarly, several IBGs may be used to supply the required voltages across a memory matrix. In an embodiment, the IBG 830 is an optional component and the activities described herein can be equally performed using an external bias generator connected to the terminals marked as Bias 0 and Bias 1. Similarly, an embodiment of the IBG may perform the activities of the external bias generator.

In an embodiment, the switches may be high voltage transistors, transfer gates implemented by use of transistors, or similar on/off devices. In an embodiment, switches 870 are designed to be high voltage switches allowing the supply of a high voltage VPP for the purpose of programming the DPNVM cell 810. For example, switch 870-1 may be on to program a logical "0" value to be stored in DPNVM cell 810, and switch 870-2 may be to program a logical "1" is to be programmed. It should be noted that switches 870-1 and 870-2 may not be on at the same time.

As the circuit is comprised of P-channel transistors, the active value is a logical low and the non-active is a logical high. When a logical low is applied on a correctly biased P-channel transistor it will be in a conducting mode, while a logical high will result in the transistor being effectively non-conducting. The transistors of the DPNVM cell 810, sensing control circuit 820, and switches implemented as transistors of the test circuit 805 and are implemented using P-channel transistors, however a person skilled in the art could also implement the circuit using N-channel transistors.

In an embodiment, the charge storage component 810 and the sense control circuit 820 are internal to the non-volatile memory cell 880. Thus, the sense control circuit 820 is not a single control circuit external to the memory array controlling the read and the write operations of all the charge storage components in the memory array storing data. The sense control circuitry is replicated in each non-volatile memory cell 880 formed in the memory array. The sense control circuit 820 controls operations, such as read and test, for that particular non-volatile memory cell 880. However, some embodiments may have the sense control circuit 820 discrete from the non-volatile memory cell 880.

Figure 9:
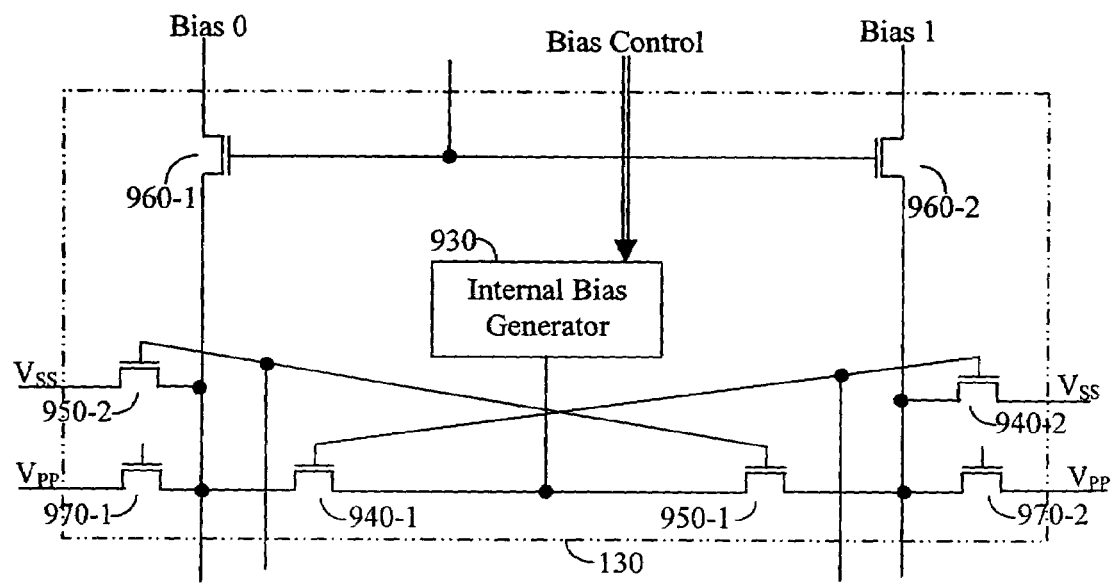
FIG. 9 illustrates a schematic diagram of an embodiment of the test circuit.

FIG. 9 illustrates a schematic diagram of an embodiment of the test circuit. The test circuit has an internal bias generator 930 and switches 940, 950, 960 and 970. Switches 940, 950, 960 and 970 are implemented by N-channel transistors that are active upon providing a positive value to their gate.

Figure 10:
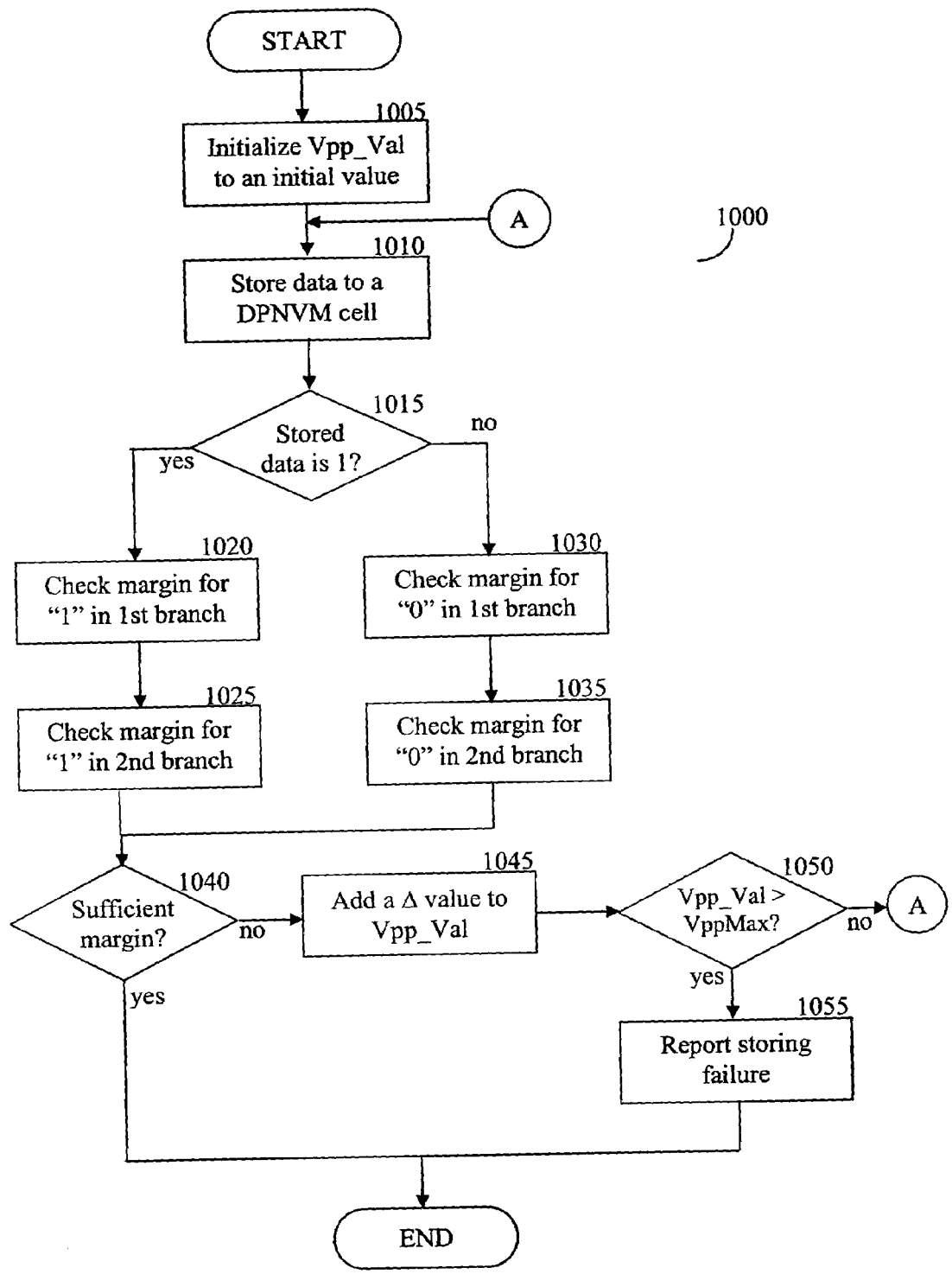
FIG. 10 illustrates a flowchart of an embodiment of a store and test operation of an embodiment of the test circuit.

FIG. 10 illustrates a flowchart of an embodiment of a store and test operation of an embodiment of the test circuit.

In block 1005, an initial voltage level of a storing voltage is established. The initial value for Vpp, for example 5.8 volts, is stored in a variable Vpp_Val. In an embodiment, the initial voltage level is a minimum storing voltage expected to be capable of providing sufficient charges to a charge storage component to exceed the industry retention requirements. In block 1010, the test circuit applies a storing voltage, Vpp equal to the value stored in Vpp_Val, to the DPNVM cell in order to store data, such as a logic level "0" or logic level "1", in the DPNVM cell.

In block 1015, a bias voltage from the bias generator is supplied to the dual polarity non-volatile memory cell. The DPNVM is then checked to ensure that a sufficient margin for sensing a logic value stored in the dual polarity non-volatile memory cell is available. The DPNVM is checked whether the data stored is a logical "1" or not. If the answer is "yes" then blocks 1020 and 1025 are performed, otherwise a "0" was stored and hence blocks 1030 and 1035 are performed. However, the blocks performed in each of these branches of the flowchart are similar, and intended to check the margin in both the positive and negative polarity branches of the DPNVM cell.

For example, block 1020 checks whether a sufficient margin of charge exists to sense a logic value of "1." A way this could be performed was described above in detail, and repeated briefly here. A bias voltage is applied on the positive branch such that it opposes the voltage of the respective coupling capacitor 812. If despite the presence of the bias voltage from the bias generator, the sense amplifier is capable of outputting the correct logical value, i.e., a logical "1", then it is validated that a sufficient margin is available. In block 1025 the process is repeated for the negative polarity branch of the DPNVM.

In blocks 1040 the test circuit checks if there was sufficient margin for sensing the stored logic value. This requires that both portions of the DPNVM have showed that they have a sufficient sensing margin. If any one of the portions of the DPNVM does not have a sufficient margin, then execution continues with block 1045. However, if both margins are determined to be sufficient then the programming of the DPNVM cell is complete.

In block 1045, if there is an insufficient margin then a delta voltage value is added to the initial voltage level of the storing voltage. After the boost of the storing voltage level, then blocks beginning with block 1010 are performed again. The delta value, for example 0.2 volts, is added to the Vpp_Val variable. The delta value plus the initial voltage level of the storing establishes the latest voltage level of the storing voltage. In block 1050, if the latest voltage level of the storing voltage has a summed value that is below or equal to a maximum storing voltage value, then another delta voltage value is added to the latest voltage level of the storing voltage. The summed latest voltage level is the initial voltage level plus all increases due to subsequently added delta voltages. Next, blocks beginning with block 1010 are performed again. Thus, the latest voltage level is compared against the maximum allowed value of Vpp, i.e., VppMax, e.g., 8.8 volts. If the latest value of Vpp_Val does not exceed the value of VppMax, then execution continues with block 1010, i.e., another attempt to store the data in the DPNVM cell above the level of the minimum expected voltage margin reached to as a result of charge loss over a period of ten years. However, if the latest Vpp_Val exceeds the value of VppMax, then execution continues with block 1055 where a report of a storing failure is provided, after which execution is ceased.

Figure 11:
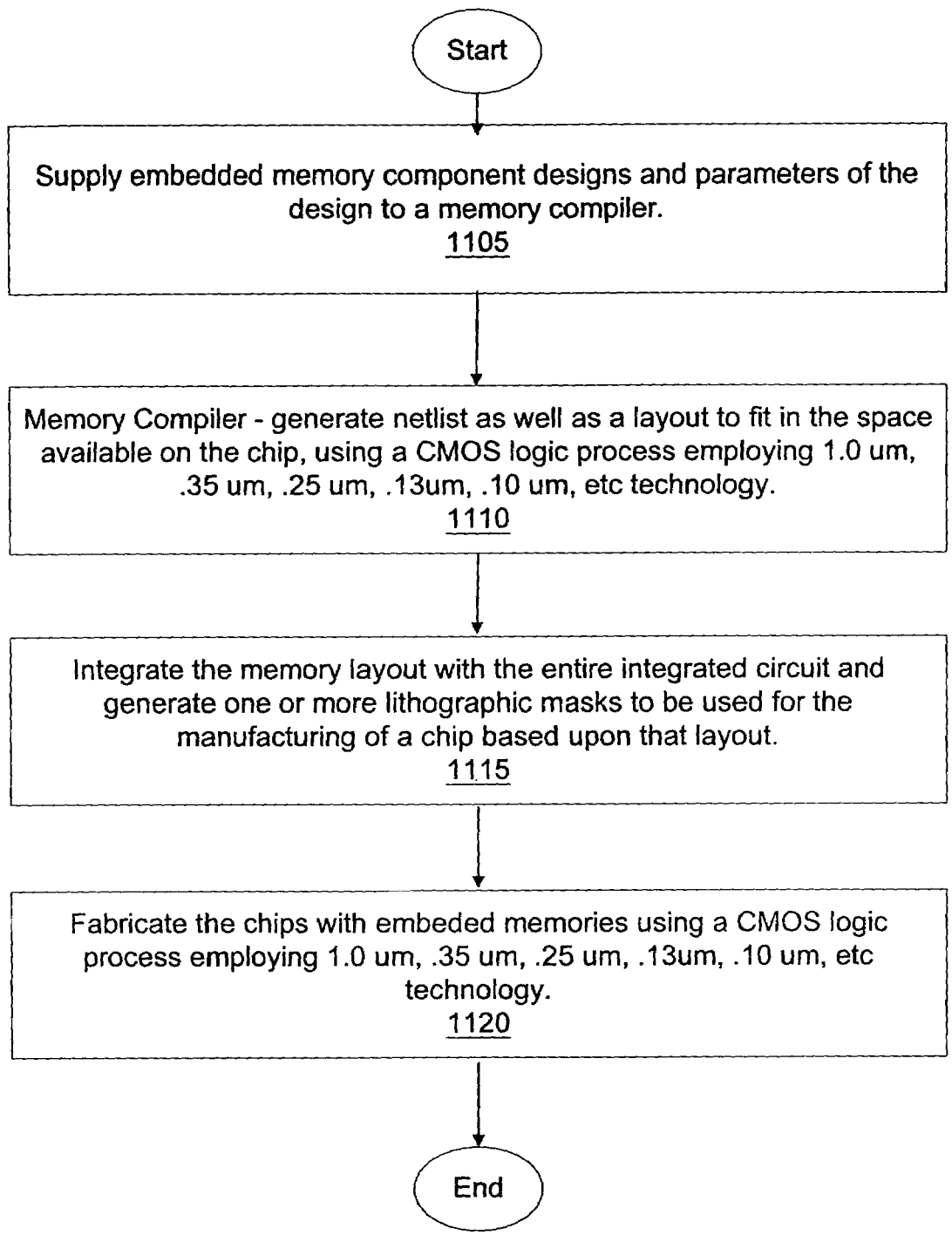
FIG. 11 illustrates an example process of generating an embedded memory from designs of memory component with an embodiment of a memory compiler.

FIG. 11 illustrates an example process of generating an embedded memory from designs of memory component with an embodiment of a memory compiler. In block 1105, the designs for each memory component for the embedded memory are supplied to the memory compiler, as well as other design parameters such as the number of columns and number of rows of the array, the available size on the chip and others. Thus, the designs for one or more dual polarity electrically alterable nonvolatile memory cells, test circuits, and sense amplifier circuits in a given System On a Chip (SoC) may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system IC integrators to rapidly create hundreds of silicon-proven memory cores. The memory compiler receives the memory component designs and utilizes those memory component designs in conjunction with memory circuit designs to optimize a circuit design and layout in the space available on a target chip. For example, the dual polarity electrically-alterable non-volatile memory cell, test circuit, and sense amplifier may be basic memory building blocks utilized in a design of a non-volatile random access memory compiler.

In block 1110, the memory compiler generates a netlist and a layout targeted to fit in the space available on a target chip. The memory compiler stores the data representing the embedded memory typically on a machine-readable medium. The memory compiler selects the memory component building blocks so that they are sized appropriate for the targeted fabrication technology. The memory compiler then provides the memory layout to be used to generate one or more lithographic masks to be used in the fabrication of that embedded memory. The memory compiler also provides a netlist for verification of the embedded memory.

In block 1115, the memory layout generated is integrated with the rest of the layout for the chip and a machine generates the lithographic masks that contain the information necessary for the fabrication of a functional device. The machine generates one or more lithographic masks to be used to transfer that circuit design onto the chip. The non-volatile memory solution for embedded applications integrates easily with the standard single poly CMOS processes.

In block 1120, a fabrication facility fabricates the chips with the embedded memories using the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less, to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself. In an embodiment, the embedded memory containing one or more electrically-alterable non-volatile memory cell can be embedded into a SoC and can be fabricated in a state-of-the-art, leading edge standard logic process with no additional process steps or additional special masks. In an embodiment, the electrically-alterable non-volatile memory cell compiler is designed for embedded applications in the standard CMOS logic process.

In one embodiment, the software used to facilitate the memory compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

In an embodiment, an example memory compiler may comprise the following. A graphic user interface, a common set of processing elements, and a library of files containing design elements such as circuits, control logic, and cell arrays that define the complier. In an embodiment, object code in a set of executable software programs. A nonvolatile random access memory compiler architecture that includes one or more electrically-alterable non-volatile memory cells is a serial/parallel memory featuring a static random access memory (SRAM) section overlaid bit-for-bit with a non-volatile electrically alterable read only memory (EAROM). The nonvolatile random access memory compiler is designed for embedded applications in the logic process. No additional special masks or special process steps are required. The nonvolatile random access memory design allows data to be easily transferred from SRAM to EAROM section (STORE operation) and back from EAROM to SRAM section (RECALL operations). The STORE and RECALL operations work simultaneously with all memory bits. The STORE operation may be usually completed in less than 300 ms (around 20 us per bit for the largest 16384 bit instance) and the RECALL operation is completed in 10 us or less (around 0.6 ns per bit for the largest 16384 bit instance).

The nonvolatile random access memory is designed for unlimited serial and parallel access to the SRAM section and minimum of 1000 STORE operations to the EAROM. Data retention is specified to be greater than 10 years in power off state (storage) or idle mode and unlimited in the keep mode. Endurance (data changes per bit) is specified to be 100 or more.

For applications where low pin count interface is essential a serial access port can be used (SHIFT cycle). During the SHIFT cycle the SRAM section is reconfigured as a single long shift register and data can be shifted serially in via the serial input (SI) pin and observed on the serial output (SO) pin.

As noted, in an embodiment, a designer chooses the specifics of the memory configuration to produce a set of files defining the requested memory instances. A memory instance may include front end views and back end files. The front end views support documentation, simulation, debugging, and testing. The back end files, such as a layout, physical LEF, etc are for layout and fabrication.

While some specific embodiments of the invention have been shown the invention is not to be limited to these embodiments. For example, the doping of the components may be reversed for implementing a NMOS structure. Geometric arrangements of the components may change. In a dual polarity NVM cell, all of the capacitors could exist in their own Nwell. Thus, a first coupling capacitor in a first well, a first tunneling capacitor in a second well, a second tunneling capacitor in a third well, and a second coupling capacitor in a fourth well. Dopings of the components may change, etc. The sense mode component may include both the first read transistor and the second read transistor. The sense mode component may be single read transistor connector to a multiplexer to convey the differential charge stored by both floating gates. The invention is to be understood as not limited by the specific embodiments described herein, but only by scope of the appended claims.

What is claimed is:

1. A sense amplifier to sense data from one or more memory cells, comprising:
    a current source;
    a sense amplifier circuit coupled to the current source to provide current for the sense amplifier circuit and coupled to the one or more memory cells to sense a charge being stored by each memory cell; and
    store protection circuitry to reduce a voltage potential across critical nodes of the sense amplifier circuit to a difference between a store voltage and Vdd when the store voltage is about to be applied to at least a first memory cell from the one or more memory cells by connecting Vdd to one or more of the critical nodes of the sense amplifier circuit when the store voltage is about to be applied to at least the first memory cell from the one or more memory cells.

2. The sense amplifier of claim 1, further comprising:
    an idling circuitry having one or more switches to disable the current source.

3. The sense amplifier of claim 2, wherein the idling circuit to substantially eliminate current drain from the sense amplifier by reducing a voltage potential across critical nodes of the sense amplifier circuit to substantially zero by use of the one or more switches that isolate the sense amplifier circuit from a power supply when the sense amplifier circuit is idle.

4. The sense amplifier of claim 2, wherein the current source activates or disables upon receiving a control signal from the idling circuitry.

5. The sense amplifier of claim 1, wherein the critical nodes of the sense amplifier circuit are coupled to level of voltage other than Vdd by use of the one or more switches in the idling circuitry when the sense amplifier circuit is idle.

6. The sense amplifier of claim 5, wherein the level of voltage other than Vdd is approximately Vss.

7. The sense amplifier of claim 1, wherein at least a first dual-polarity non volatile memory cell is part of the one or more memory cells coupled to the sense amplifier and a maximum sensing error voltage of the sense amplifier is designed to be at least smaller than a voltage margin available between a floating gate of a first coupling capacitor and a floating gate of a second coupling capacitor of the dual-polarity non-volatile memory cell after a predetermined retention period.

8. The sense amplifier of claim 1, wherein the sense amplifier circuit is operable to provide a valid read under conditions where a first coupling capacitor in a dual-polarity non-volatile memory cell is significantly more leaky than a second coupling capacitor in a dual-polarity non-volatile memory cell.

9. The sense amplifier of claim 1, wherein the one or more switches are transistors.

10. The sense amplifier of claim 1, wherein at least a first dual-polarity non volatile memory cell is part of the one or more memory cells coupled to the sense amplifier and the first dual-polarity non volatile memory cell includes a charge mode component to facilitate storing of the information stored in the dual-polarity non-volatile memory cell, and the charge mode component includes a first coupling capacitor in a first well, a first tunneling capacitor in a second well, and a second coupling capacitor in the second well.

11. The sense amplifier of claim 10, wherein the first dual-polarity non-volatile memory cell further includes a first read transistor connected to the second coupling capacitor and the first tunneling capacitor.

12. A machine readable storage medium that stores data representing the apparatus of claim 1, which when manipulated by a machine creates a representation of the apparatus of claim 1.

13. The machine-readable medium of claim 12, wherein the machine-readable medium comprises a memory compiler to provide a layout utilized to generate one or more lithographic masks used in fabrication of the apparatus of claim 12.

14. A method, comprising
    sensing data from one or more memory cells;
    providing current to sense the data being stored by each memory cell; and
    altering a voltage potential across critical nodes of a sense amplifier circuit during different modes of operation of the sense amplifier including making the voltage potential across the critical nodes approximately equal to a difference between a store voltage and Vdd when the store voltage is about to be applied to at least a first memory cell from the one or more memory cells.

15. The sense amplifier of claim 14, further comprising: disabling a current source to the sense amplifier circuit when the sense amplifier circuit is idle.

16. The sense amplifier of claim 14, further comprising: isolating the sense amplifier circuit from a power supply when the sense amplifier is idle.

17. The sense amplifier of claim 14, further comprising: providing a valid read of data stored in a dual polarity non-volatile memory cell under conditions when a first coupling capacitor in the dual polarity non-volatile memory cell is significantly more leaky than a second coupling capacitor in the dual polarity non-volatile memory cell.

18. A machine readable storage medium that stores data and instruction to perform representations of the operations of the method of claim 14, which when manipulated by a machine creates a simulation of the operations in the method of claim 14.

19. The machine-readable medium of claim 18, wherein the machine-readable medium comprises a memory compiler.

* * * * *

UNITED STATES PATENT AND TRADEMARK OFFICE
CERTIFICATE OF CORRECTION

PATENT NO. : 7,355,914 B2  Page 1 of 1
APPLICATION NO. : 11/590695
DATED : April 8, 2008
INVENTOR(S) : Jaroslav Raszka It is certified that error appears in the above-identified patent and that said Letters Patent is hereby corrected as shown below:

On the Title Page, after item (22), it should read:

Related U.S. Application Data

Item (63)    Divisional of Patent No. 7,130,213 filed December 6, 2002

Item (60)    Provisional application No. 60/340,149 filed December 6, 2001

Signed and Sealed this

Seventeenth Day of June, 2008

JON W. DUDAS
*Director of the United States Patent and Trademark Office*